US008581824B2

(12) United States Patent
Baek et al.

(10) Patent No.: US 8,581,824 B2
(45) Date of Patent: Nov. 12, 2013

(54) HYBRID DIGITAL TO ANALOG CONVERTER, SOURCE DRIVER, AND LIQUID CRYSTAL DISPLAY DEVICE

(75) Inventors: Jong-Hak Baek, Seoul (KR);
Yoon-Kyung Choi, Yongin-si (KR);
Oh-Kyong Kwon, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 778 days.

(21) Appl. No.: 12/706,031

(22) Filed: Feb. 16, 2010

(65) Prior Publication Data
US 2010/0207967 A1 Aug. 19, 2010

(30) Foreign Application Priority Data
Feb. 13, 2009 (KR) .................. 10-2009-0011718

(51) Int. Cl.
*G09G 5/10* (2006.01)
(52) U.S. Cl.
USPC ............. 345/100; 345/89; 345/204; 345/690; 341/144
(58) Field of Classification Search
USPC .............. 345/100, 89, 204, 690; 341/144–154
See application file for complete search history.

(56) References Cited

U.S. PATENT DOCUMENTS

| 5,585,795 | A | * | 12/1996 | Yuasa et al. | 341/118 |
|---|---|---|---|---|---|
| 5,731,774 | A | * | 3/1998 | Fujii et al. | 341/144 |
| 6,157,360 | A | * | 12/2000 | Jeong et al. | 345/98 |
| 6,246,351 | B1 | * | 6/2001 | Yilmaz | 341/145 |
| 6,617,989 | B2 | * | 9/2003 | Deak | 341/144 |
| 6,670,938 | B1 | * | 12/2003 | Yoshida | 345/98 |
| 7,403,182 | B2 | * | 7/2008 | Lee | 345/89 |
| 7,609,191 | B2 | * | 10/2009 | Chang et al. | 341/145 |
| 7,612,751 | B2 | * | 11/2009 | Lee | 345/89 |
| 7,750,900 | B2 | * | 7/2010 | Tsuchi et al. | 345/210 |
| 7,936,330 | B2 | * | 5/2011 | Park et al. | 345/99 |
| 8,022,902 | B2 | * | 9/2011 | Lee | 345/76 |
| 8,094,098 | B2 | * | 1/2012 | Lee | 345/77 |
| 8,217,883 | B2 | * | 7/2012 | Ishii et al. | 345/98 |
| 2005/0128170 | A1 | * | 6/2005 | Kang et al. | 345/87 |
| 2005/0140618 | A1 | * | 6/2005 | Kang et al. | 345/87 |
| 2005/0156851 | A1 | * | 7/2005 | Yun | 345/98 |
| 2006/0214900 | A1 | * | 9/2006 | Tsuchi et al. | 345/98 |
| 2007/0200808 | A1 | * | 8/2007 | Lee | 345/88 |
| 2007/0216633 | A1 | * | 9/2007 | Kim | 345/100 |
| 2007/0236289 | A1 | * | 10/2007 | Iriguchi | 330/253 |
| 2007/0268225 | A1 | * | 11/2007 | Woo et al. | 345/89 |

(Continued)

FOREIGN PATENT DOCUMENTS

| JP | 2008-034955 | 2/2008 |
|---|---|---|
| KR | 20060131341 | 12/2006 |
| KR | 100800494 | 1/2008 |

*Primary Examiner* — Lun-Yi Lao
*Assistant Examiner* — Kelly B Hegarty
(74) *Attorney, Agent, or Firm* — Stanzione & Kim, LLP

(57) ABSTRACT

A hybrid digital to analog converter (DAC) includes a first digital to analog converting unit (DACU) and a second DAC unit. The first DAC unit provides an analog voltage corresponding to Q-bit upper data of P-bit gray data, in response to a plurality of gamma voltages, where P is a natural number equal to or greater than 10 and Q is a natural number less than 10. The second DAC unit provides an analog current having a magnitude according to each bit level of R-bit lower data of the P-bit gray data, based on a rated current generated from a reference voltage, where R is a natural number corresponding to P-Q.

17 Claims, 8 Drawing Sheets

(56) References Cited

U.S. PATENT DOCUMENTS

| | | | |
|---|---|---|---|
| 2008/0030489 A1* | 2/2008 | Kim et al. | 345/205 |
| 2008/0165168 A1* | 7/2008 | Tsuchi | 345/204 |
| 2008/0297390 A1* | 12/2008 | Ko et al. | 341/144 |
| 2009/0015574 A1* | 1/2009 | Kim et al. | 345/208 |
| 2009/0066678 A1* | 3/2009 | Tanaka | 345/204 |
| 2009/0146940 A1* | 6/2009 | Kang et al. | 345/100 |
| 2009/0303225 A1* | 12/2009 | Kang et al. | 345/213 |
| 2010/0052966 A1* | 3/2010 | Tsuchi | 341/154 |
| 2010/0156867 A1* | 6/2010 | Kim et al. | 345/208 |
| 2010/0259564 A1* | 10/2010 | Ahn et al. | 345/690 |

\* cited by examiner

HYBRID DIGITAL TO ANALOG CONVERTER, SOURCE DRIVER, AND LIQUID CRYSTAL DISPLAY DEVICE

CROSS-REFERENCE TO RELATED APPLICATIONS

This application claims priority under 35 USC §119 to Korean Patent Application No. 2009-0011718, filed on Feb. 13, 2009 in the Korean Intellectual Property Office (KIPO), the contents of which are herein incorporated by reference in their entirety.

BACKGROUND

1. Field of the Invention

Example embodiments relate to display devices, and more particularly to a hybrid digital to analog converter, a source driver, and a liquid crystal display device.

2. Description of the Related Art

Recently, liquid crystal display (LCD), which may be flat panel devices, have been widely adopted in note-book computers, televisions, and mobile phones, because the LCD devices are light, thin, small, and consume little power.

Generally, an LCD device may include an LCD panel to display images and a source driver and a gate driver to drive the LCD panel. The LCD panel includes a plurality of data lines to receive data voltages from the source driver and a plurality of gate lines to receive gate voltages from the gate driver. A plurality of pixel areas are defined by the data lines and the gate lines in the LCD panel, and each pixel area includes a pixel having a thin film transistor and a pixel electrode.

When a number of digital bits of RGB (red, green and blue) data increases to enhance quality of images in the LCD device, the size of a decoder to decode the RGB data increases exponentially.

A conventional digital to analog converter employs a resistor string. The conventional digital to analog converter includes a resistor sting to provide gray voltages and a plurality of switches to select the gray voltages in response to input data. Gray voltages are defined as a gradient scale of voltages of varying levels between two voltages, such as a high input voltage and a low input voltage. When a number of digital bits of RGB data increases to enhance quality of images in the conventional digital to analog converter, a size of the digital to analog converter increases greatly because a number of the switches increases exponentially. For example, when the RGB data increases by N bits, the size of the digital to analog converter increases $2^N$ times.

SUMMARY

Example embodiments provide a hybrid digital to analog converter capable of enhancing image quality while reducing circuit size.

Example embodiments provide a source driver including the hybrid digital to analog converter.

Example embodiments provide a LCD device including the source driver.

Additional features and utilities of the present general inventive concept will be set forth in part in the description which follows and, in part, will be obvious from the description, or may be learned by practice of the general inventive concept.

Features and/or utilities of the present general inventive concept may also be realized by an integrated circuit to control voltage output to a display panel, the integrated circuit including at least one first channel including a first digital-to-analog converter unit ("DAC unit") and a second DAC unit to output voltages corresponding to high bits and low bits, respectively, of a first segment of a voltage control signal, at least a second channel including a third DAC unit and a fourth DAC unit to output voltages corresponding to a second segment of a voltage control signal, a gamma voltage generation unit to provide gamma voltages to the first and third DAC units, and a single voltage-to-current converter ("VIC") to provide input voltage to the second and fourth DAC units.

The first and second channels may further include first and second output buffers, respectively, to receive voltage outputs from the first, second, third, and fourth DAC units, respectively, and to output high and low driving voltages, respectively.

Features and/or utilities of the present general inventive concept may also be realized by a hybrid digital-to-analog converter ("DAC") including a first digital-to-analog converting unit ("DAC unit") to receive first digital display data and high and low gamma voltages and to output a corresponding analog voltage and a second DAC unit to receive second digital display data and a first current and to output a corresponding analog current. One of the first and second display data may correspond to high bits of a display data segment and the other of the first and second digital display data corresponds to low bits of the display data segment.

The first digital-to-analog converting unit may include a gray voltage generation unit to receive one of the high and low gamma voltages, a switching unit to receive a plurality of gray voltages from the gray voltage generation unit, and a decoder to receive the first digital display data and to control the switching unit to output a predetermined voltage corresponding to a fraction of the one of the high and low gamma voltages.

The gray voltage generation unit may include a plurality of resistors connected in series, the switching unit may include a plurality of transistors, each having a source connected between two of the plurality of resistors, respectively, and a drain connected to a drain of each other transistor of the plurality of transistors, and the decoder may control a voltage to a gate of each of the plurality of transistors to turn on and off each of the plurality of transistors.

The second DAC unit may include a weighted current generation unit to receive first and second input voltages of the first current and to output a plurality of currents and a switching unit to output the analog current corresponding to a combination of the plurality of currents from the weighted current generation unit.

The weighted current generation unit may include a plurality of pairs of transistors, a transistor of each pair connected in series with another transistor of the pair and with a respective switch of the switching unit, each pair of transistors connected in parallel with each other pair of transistors, a gate of a first transistor of each pair of transistors is connected to the first input voltage, and a gate of a second transistor of each pair of transistors is connected to the second input voltage.

The switching unit may include a plurality of transistors, each transistor having a gate connected to a respective bit of the second digital display data.

The hybrid DAC may further include a protection circuit consisting of a transistor having an input terminal connected to an output of each of the plurality of transistors of the switching unit and an output terminal to output the analog current.

Features and/or utilities of the present general inventive concept may also be realized by a source driver to drive a display including an input unit to receive input data and an input clock and to output digital display data and a hybrid digital-to-analog converter (DAC). The hybrid DAC may include a first digital-to-analog converting unit ("DAC unit") to receive first digital display data and high and low gamma voltages and to output a corresponding analog voltage, and a second DAC unit to receive second digital display data and a first current and to output a corresponding analog current. One of the first and second digital display data may correspond to high bits of a display data segment and the other of the first and second digital display data may correspond to low bits of the display data segment.

The source driver may further include a gamma voltage generation unit to generate the high and low gamma voltages and a voltage-to-current inverter to generate first and second voltages having the first current.

The source driver may further include an output buffer unit to receive the analog voltage and the analog current and to output a display-driving voltage corresponding to the analog voltage and the analog current.

The output buffer may include an operational amplifier (op-amp) having a positive and a negative input terminal and an output terminal and a resistor connected between the output terminal and one of the positive and negative input terminals. One of the analog voltage and the analog current may be connected to the positive terminal and the other of the analog voltage and the analog current may be connected to the negative terminal, and the resistor may be connected to the one of the positive and negative input terminals that corresponds to the analog current.

The source driver may further include a current mirror circuit connected between an output of the second DAC unit and the one of the positive and negative input terminals that corresponds to the analog current.

Features and/or utilities of the present general inventive concept may also be realized by a display device including a display panel to display an image, the display panel including gate lines and source lines, a gate driver to drive the gate lines, and a source driver to drive the source lines. The source driver may include an input unit to receive input data and an input clock and to output digital display data and a hybrid digital-to-analog converter (DAC). The hybrid DAC may include a first digital-to-analog converting unit ("DAC unit") to receive first digital display data and high and low gamma voltages and to output a corresponding analog voltage and a second DAC unit to receive second digital display data and a first current and to output a corresponding analog current. One of the first and second digital display data corresponds to high bits of a display data segment and the other of the first and second digital display data corresponds to low bits of the display data segment.

The panel may be an LCD panel.

The display device may further include a timing controller to receive display data and at least one clock signal and to output the first and second digital display data corresponding to the received display data and the at least one clock signal to the first and second DAC units respectively.

Accordingly, the hybrid DAC according to example embodiments may reduce a circuit size and display high quality images by including the first digital-to-analog converter unit which is a resistor string type operating with a high voltage and the second digital-to-analog converter unit which is a binary-weighted current type operating with a low voltage.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
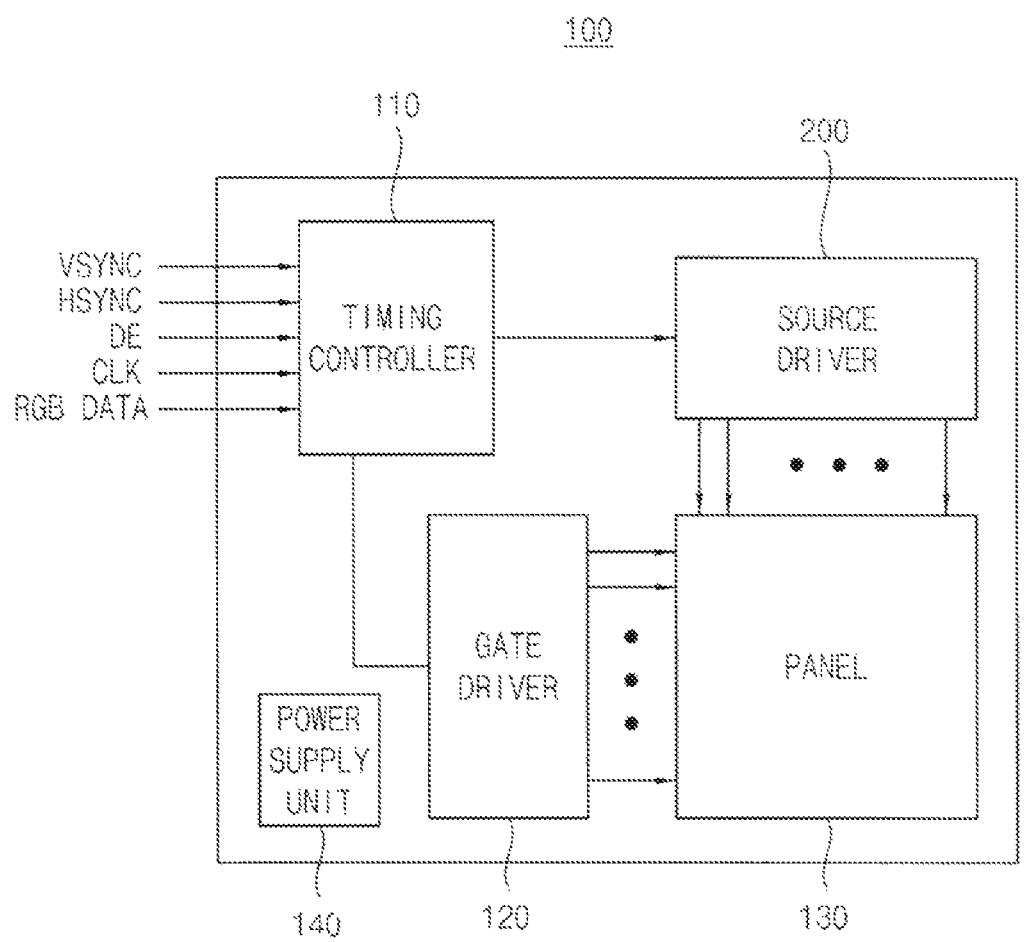
FIG. 1 is a block diagram illustrating a LCD device according to an example embodiment.

Various example embodiments will be described more fully hereinafter with reference to the accompanying drawings, in which some example embodiments are shown. The present general inventive concept may, however, be embodied in many different forms and should not be construed as limited to the example embodiments set forth herein. Rather, these example embodiments are provided so that this disclosure will be thorough and complete, and will fully convey the scope of the present general inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an LCD device according to an example embodiment.

Referring to FIG. 1, an LCD device 100 includes a timing controller 110, a source driver 200, a gate driver 120, an LCD panel 130, and a power supply unit 140.

The timing controller 110 receives a vertical synchronization signal VSYNC, a horizontal synchronization signal HSYNC, a data enable signal DE, a clock signal CK, and red, green, and blue (RGB) data for each frame from a graphic controller (not illustrated), and transmits the RGB data, a source driver control signal, and a gate driver control signal to the source driver 200 and the gate driver 120.

The source driver 200 receives the RGB data and the source driver control signal from the timing controller 110, and outputs the RGB data to the LCD panel (or panel) 130 line-by-line in response to the horizontal synchronization signal HSYNC.

The gate driver 120 includes a plurality of gate lines and receives the gate driver control signal outputted from the timing controller 110. The gate driver 120 controls the gate lines so as to sequentially output to the panel 130 the data outputted from the source driver 200.

The power supply unit 140 provides power to the timing controller 110, the source driver 200, the gate driver 120, and the panel 130.

Hereinafter, the operation of the LCD device in FIG. 1 will be described.

The timing controller 110 receives from the graphic controller (not shown) the RGB data representing an image, the vertical synchronization signal VSYNC, and the horizontal synchronization signal HSYNC.

The gate driver 120 receives the gate line control signal such as the vertical synchronization signal VSYNC and performs a shift operation on the vertical synchronization signal VSYNC to control the gate lines based on the shifted vertical synchronization signal VSYNC.

The source driver 200 receives the RGB data and the source driver control signal from the timing controller 110 and outputs a single line of the image when the gate driver 120 controls the gate lines based on the shifted vertical synchronization signal VSYNC.

Figure 2:
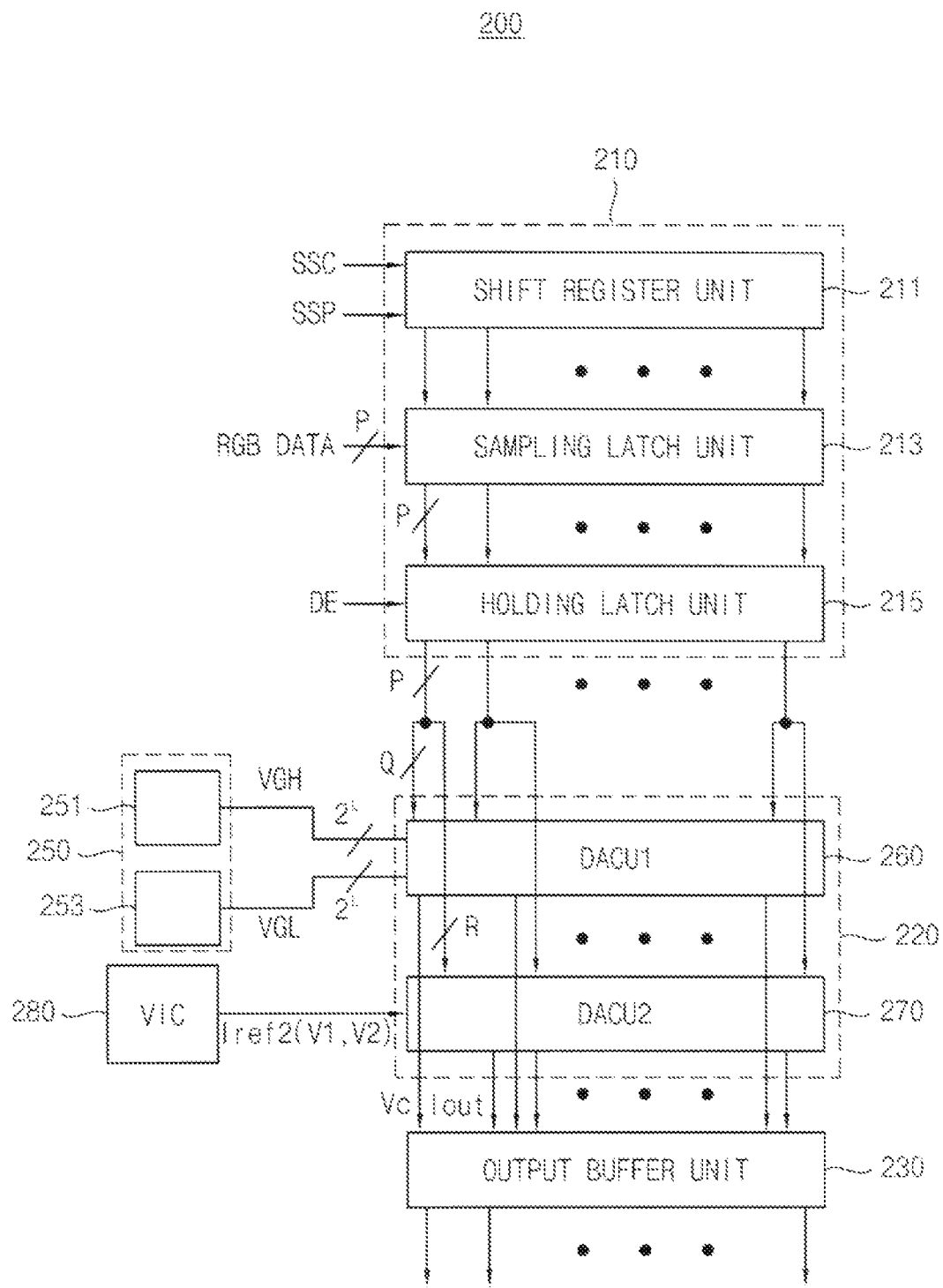
FIG. 2 is a block diagram illustrating the source driver in FIG. 1 according to an example embodiment.

FIG. 2 is a block diagram illustrating the source driver in FIG. 1 according to an example embodiment.

Hereinafter, one channel of the source driver will be described as an example.

Referring to FIG. 2, the source driver 200 includes an input unit 210, a hybrid digital-analog converter (DAC) 220, and an output buffer unit 230. The input unit 210 includes a shift register unit 211, a sampling latch unit 213, and a holding latch unit 215. The source driver 200 may further include a voltage to current converter (VIC) 280 which will be described below.

The shift register unit 211 receives a source shift clock SSC and a source start pulse SSP from the timing controller 110 in FIG. 1. The shift register unit 211 sequentially generates a plurality of sampling signals by shifting the source start pulse SSP at every period of the source shift clock SSC. The shift register unit 211 may include a plurality of shift registers (not illustrated).

The sampling latch unit 213 sequentially samples and stores image signal data (or color signal data), for example, P-bit RGB (gray) data in response to the sampling signals provided from the shift register unit 211, where P is a natural number greater than or equal to ten. The sampling latch unit 213 may include a plurality of sampling latches to store the P-bit RGB data (not illustrated).

The holding latch unit 215 receives the RGB data stored in the sampling latch unit 213 and provides the RGB data to the hybrid DAC 220 in response to the data enable signal DE from the timing controller 110.

The DAC 220 may include a first digital to analog converting unit 260 ("DACU1" or "first DAC unit") and a second digital-to-analog converter unit 270 ("DACU2" or "second DAC unit").

The first DAC unit 260 receives Q-bit upper data of P-bit gray data, converts the Q-bit upper data to an analog voltage Vc and provides the analog voltage Vc to the output buffer unit 230 in response to positive gamma voltages VGH or negative gamma voltages VGL. Gamma voltages are defines as voltages to determine a luminance or RGB values of a display, such as an LCD screen. The output buffer unit 230 may have a different architecture based on whether a gamma voltage generation unit 250 provides the positive gamma voltages VGH or the negative gamma voltages VGL. The gamma voltage generation unit 250 may include a first generation unit 251 to generate the positive gamma voltages VGH and a second generating unit 253 to generate the negative gamma voltages VGL.

Figure 3:
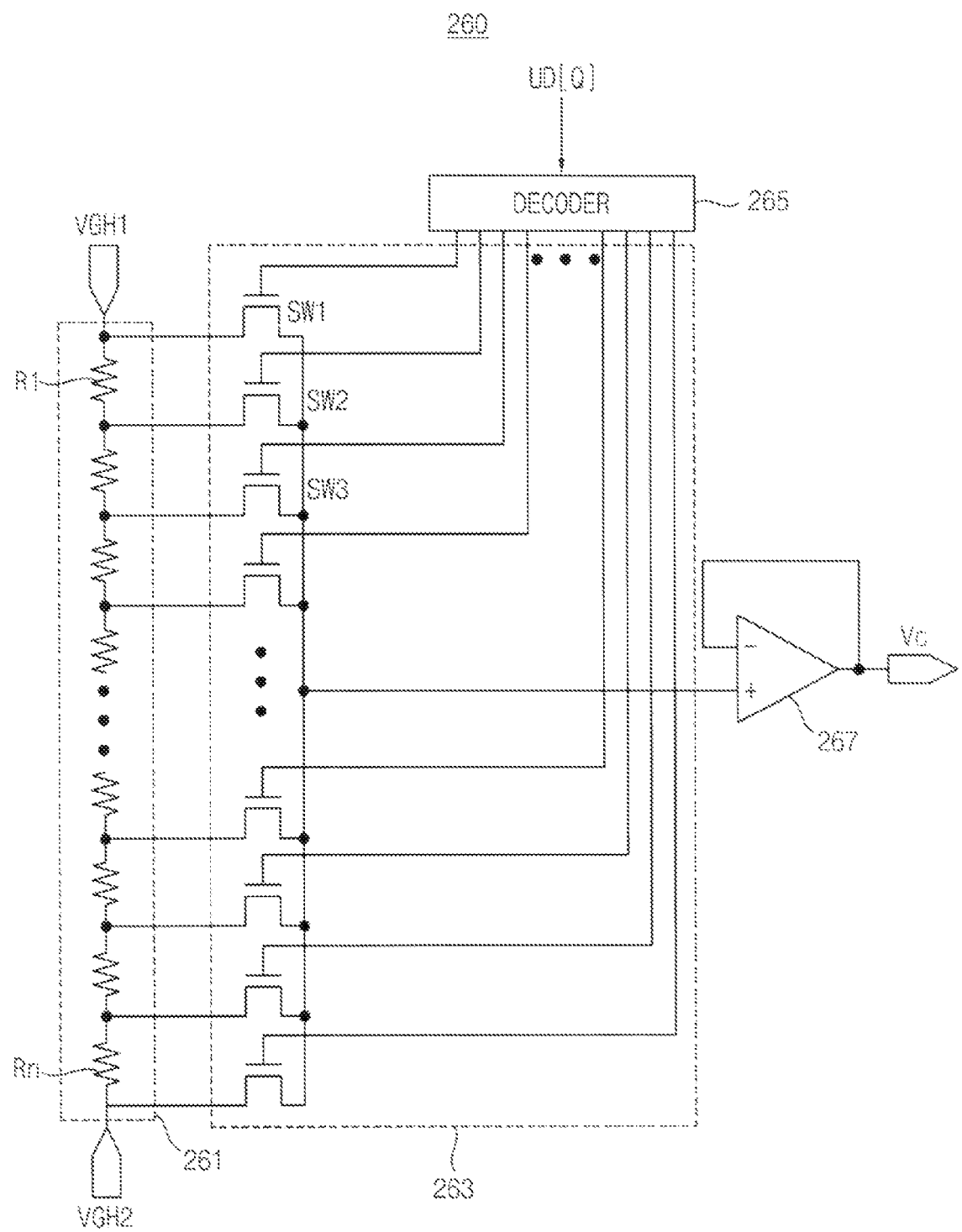
FIG. 3 is a circuit diagram illustrating a first digital-to-analog converter unit of FIG. 2.

FIG. 3 is a circuit diagram illustrating a first DAC unit of FIG. 2.

Referring to FIG. 3, the first DAC unit 260 includes a gray voltage generation unit 261, a switching unit 263, a decoder 265, and an output unit 267. The gray voltage generation unit 261 generates a plurality of gray voltages by using a resistor string $R_1 \ldots R_n$ based on gamma voltages VGH1 and VGH2. The decoder 265 selectively turns on/off a plurality of switches SW1, SW2, . . . of the switching unit 263 in response to the O-bit upper data UD[Q]. Gray voltages corresponding to the O-bit upper data UD[Q] are selected by the switching unit 263. The selected gray voltages corresponding to the O-bit upper data UD[Q] are buffered by the output unit 267 to be provided as the analog voltage Vc. The output unit 267 may be implemented with an operational amplifier which has a positive input terminal connected to the switching unit 263, and a negative input terminal connected to the output terminal to provide the analog voltage Vc. For example, when the P-bit RGB data is 12-bit data, the Q-bit upper data UD may be 6-bit data. Therefore, the first DAC unit 260 may implement 64 gray scales, or 64 gray scale voltages, in response to 6-bit upper data UD. The gamma voltages VGH and VGL provided to the first DAC unit 260 from the gamma voltage generation unit 250 may have a high a voltage level. Accordingly, high voltage devices that endure a relatively high voltages may be employed in the gray voltage generation unit 261, the switching unit 263, the decoder 265, and the output unit 267 of the first DAC unit 260.

Figure 4:
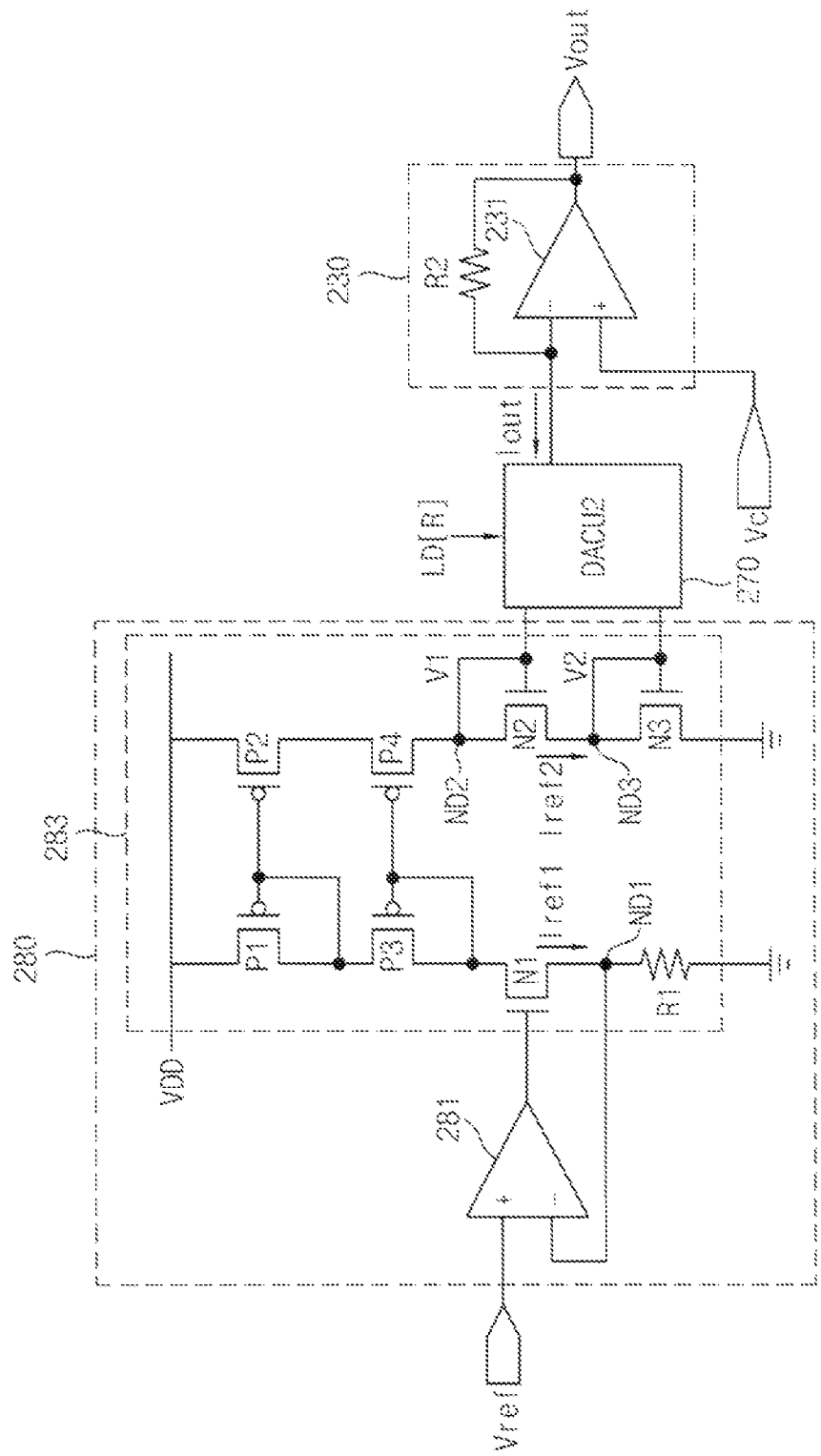
FIG. 4 illustrates the voltage-to-current converter, the second digital-to-analog converting unit, and the output buffer of FIG. 2 when positive gamma voltages are provided to the first digital-to-analog converting unit.

FIG. 4 illustrates the voltage-to-current converter ("VIC") 280, the second DAC unit 270, and the output buffer 230 of FIG. 2 when positive gamma voltages are provided to the first DAC unit 260.

Referring to FIG. 4, the VIC 280 includes a first operational amplifier 281 and a rated current generation unit 283. The first operational amplifier 281 has a first (positive) input terminal to receive a reference voltage Vref, a second (negative) input terminal connected to the rated current generation unit 283, and an output terminal connected to the rated current generation unit 283. When it is assumed that the first operational amplifier 281 is an ideal operational amplifier, a voltage of the second (negative) input terminal is the reference voltage Vref. The rated current generation unit 283 includes p-type metal oxide semiconductor (PMOS) transistors P1, P2, P3, and P4, n-type MOS (NMOS) transistors N1, N2, and N3 and a first resistor R1. The PMOS transistors P1 and P2 are respectively connected to a power supply voltage VDD, and the PMOS transistors P3 and P4 are respectively connected to the PMOS transistors P1 and P2. Each of the PMOS transistors P1 and P3 has a gate and a drain connected together. That is, the PMOS transistors P1, P2, P3, and P4 constitute a current mirror. The NMOS transistor N1 is connected between the PMOS transistor P3 and the first resistor R1, and the NMOS transistor N1 has a gate connected to the output terminal of the first operational amplifier 281. The NMOS transistors N2 and N3 connected in series between the PMOS transistor 4 and the ground, and each of the NMOS transistors N2 and N3 has a drain and a gate connected to each other. Each gate of the NMOS transistors N2 and N3 is connected to the second DAC unit 270. The rated current generation unit 283 mirrors a reference current Iref1 to provide a rated current Iref2. When it is assumed that the first operational amplifier 280 is an ideal operational amplifier, a voltage of a node ND1 connected to the second input terminal of the first operational amplifier 281 corresponds to the reference voltage Vref. Therefore, the reference current Iref1 is generated at the node ND1, and a magnitude of the reference current Iref1 corresponds to a ratio of the reference voltage Vref and the first resistor R1. A relationship of the reference current Iref1, the reference voltage Vref, and the first resistor R1 is represented as follows:

$$Iref1 = Vref/R1 \quad \text{[Equation 1]}$$

Since the PMOS transistors P1, P2, P3, and P4 constitute a current mirror, the rated current Iref2 having the same magnitude as the rated current Iref1 flows through the NMOS transistors N1 and N3. A first voltage V1 and a second voltage V2 are respectively induced at respective nodes ND2 and ND3 due to the rated current Iref2. A drain of the PMOS transistor P4 and a drain of the NMOS transistor N2 are connected at the node ND2, and a source of the NMOS transistor N2 and a drain of the NMOS transistor N3 are connected at the node ND3.

The second DAC unit 270 receives the first voltage V1 and the second voltage V2, and provides the analog current Iout corresponding to an R-bit lower data LD[R] of the P-bit RGB data to the output buffer unit 230. Operation and architecture of the second DAC unit 270 will be described with reference to FIGS. 6 and 7.

The output buffer unit 230 may include a second operational amplifier 231 and a second resistor R2. The second operational amplifier 231 has a first (positive) input terminal to receive the analog voltage Vc, a second (negative) input terminal to receive the analog current Iout, and an output terminal connected to the second input terminal through the second resistor R2. When it is assumed that the second operational amplifier 231 is an ideal operational amplifier, a relationship of the analog voltage Vc, the analog current Iout, the second resistor R2 and the driving voltage Vout is represented as follows:

$$Vout = Vc + Iout*R2 \quad \text{[Equation 2]}$$

Therefore, the output buffer unit 230 receives the analog voltage Vc and the analog current Iout and either converts the analog current Iout to a voltage or operates the analog voltage Vc and the converted voltage and provides the operated voltage as the driving voltage Vout.

Figure 5:
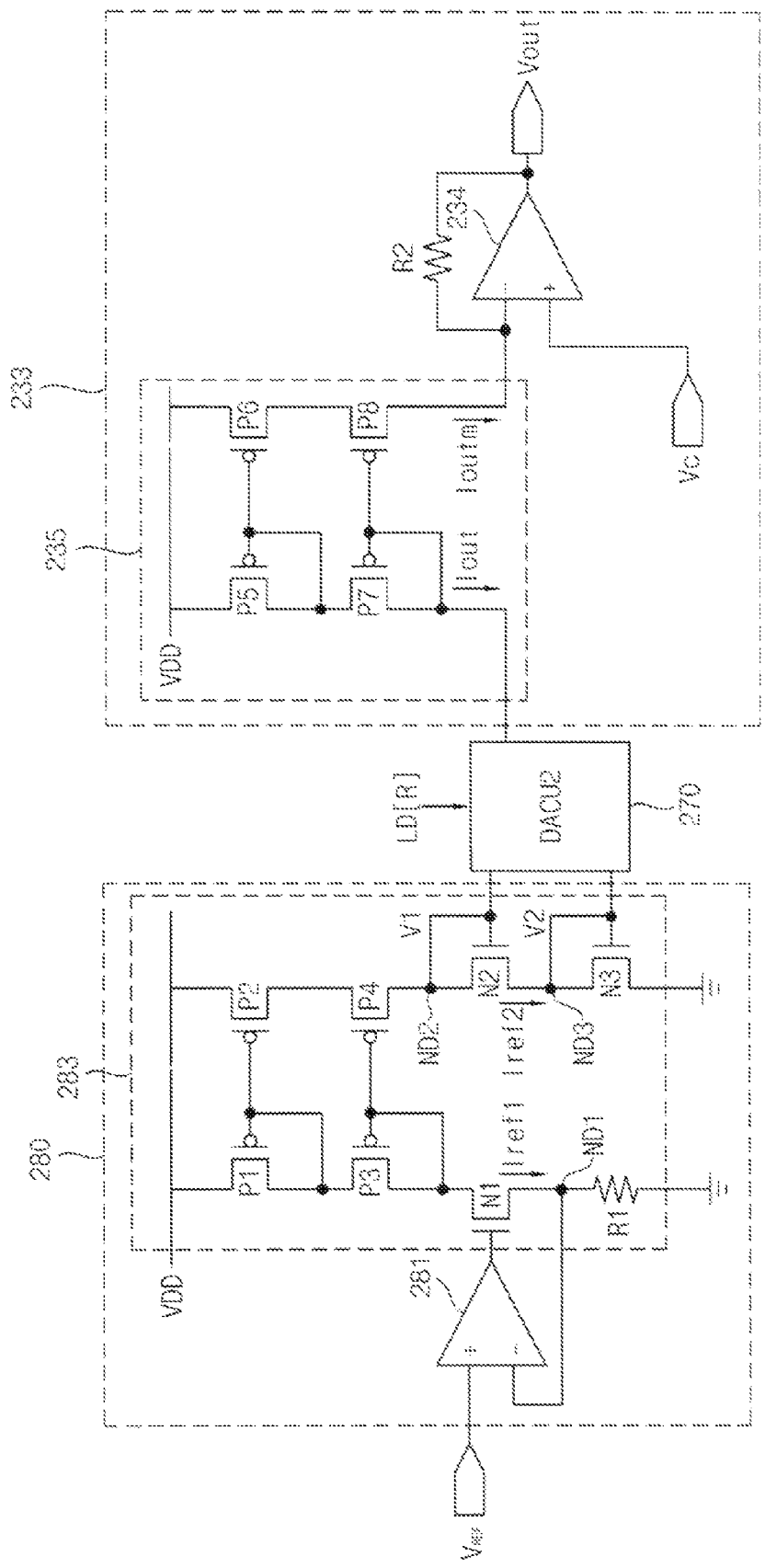
FIG. 5 illustrates the VIC, the second digital-to-analog converter unit and the output buffer of FIG. 2 when negative gamma voltages are provided to the first digital-to-analog converter unit.

FIG. 5 illustrates the VIC, the second DAC unit 270 and the output buffer of FIG. 2 when negative gamma voltages are provided to the first DAC unit 260.

Referring to FIG. 5, the VIC 280 includes the first operational amplifier 281 and the rated current generation unit 283 as illustrated in FIG. 4. The first operational amplifier 281 has a first (positive) input terminal to receive the reference voltage Vref, a second (negative) input terminal connected to the rated current generation unit 283, and the output terminal connected to the rated current generation unit 283. The voltage of the second input terminal corresponds to the reference voltage Vref. The rated current generation unit 283 includes the PMOS transistors P1, P2, P3, and P4, the NMOS transistors N1, N2, and N3 and the first resistor R1. As illustrated with reference to FIG. 4, since the PMOS transistors P1, P2, P3, and P4 constitute a current mirror, the rated current Iref2 having the same magnitude as the rated current Iref1 flows through the NMOS transistors N1 and N3. The first voltage V1 and the second voltage V2 are respectively induced at respective nodes ND2 and ND3 due to the rated current Iref2.

As illustrated with reference to FIG. 4, the second DAC unit 270 receives the first voltage V1 and the second voltage V2 and provides the analog current Iout corresponding to an R-bit lower data LD[R] of the P-bit RGB data to the output buffer unit 230. Operation and architecture of the second DAC unit 270 will be described with reference to FIGS. 6 and 7.

The output buffer unit 233 of FIG. 5 is different from the output buffer unit 230 of FIG. 4 in that the output buffer unit 233 includes a current mirror unit 235. The output buffer unit 233 further includes a second operational amplifier 234 and a second resistor R2. The current mirror unit 235 is connected to the second DAC unit 270, mirrors the analog current Iout, and provides the mirrored analog current Ioutm to the second operational amplifier 234. The second operational amplifier 234 has a first (positive) input terminal to receive the analog voltage, and a second (negative) input terminal to receive the mirrored analog current Ioutm. The second input terminal of the second operational amplifier 234 is connected to an output terminal through the second resistor R2.

When it is assumed that the second operational amplifier 234 is an ideal operational amplifier, a relationship of the analog voltage Vc, the mirrored analog current Ioutm, the second resistor R2 and the driving voltage Vout is represented as follows:

$$Vout = Vc - Ioutm*R2 \quad \text{[Equation 3]}$$

Here, the mirrored analog current Ioutm is replaced with the analog current Iout, and thus Equation 3 is converted to following Equation 4.

$$Vout = Vc - Iout*R2 \quad \text{[Equation 4]}$$

Therefore, the output buffer unit 230 receives the analog voltage Vc and the analog current Iout and either converts the analog current Iout to a voltage or operates the analog voltage Vc and the converted voltage and provides the operated voltage as the driving voltage Vout.

Figure 6:
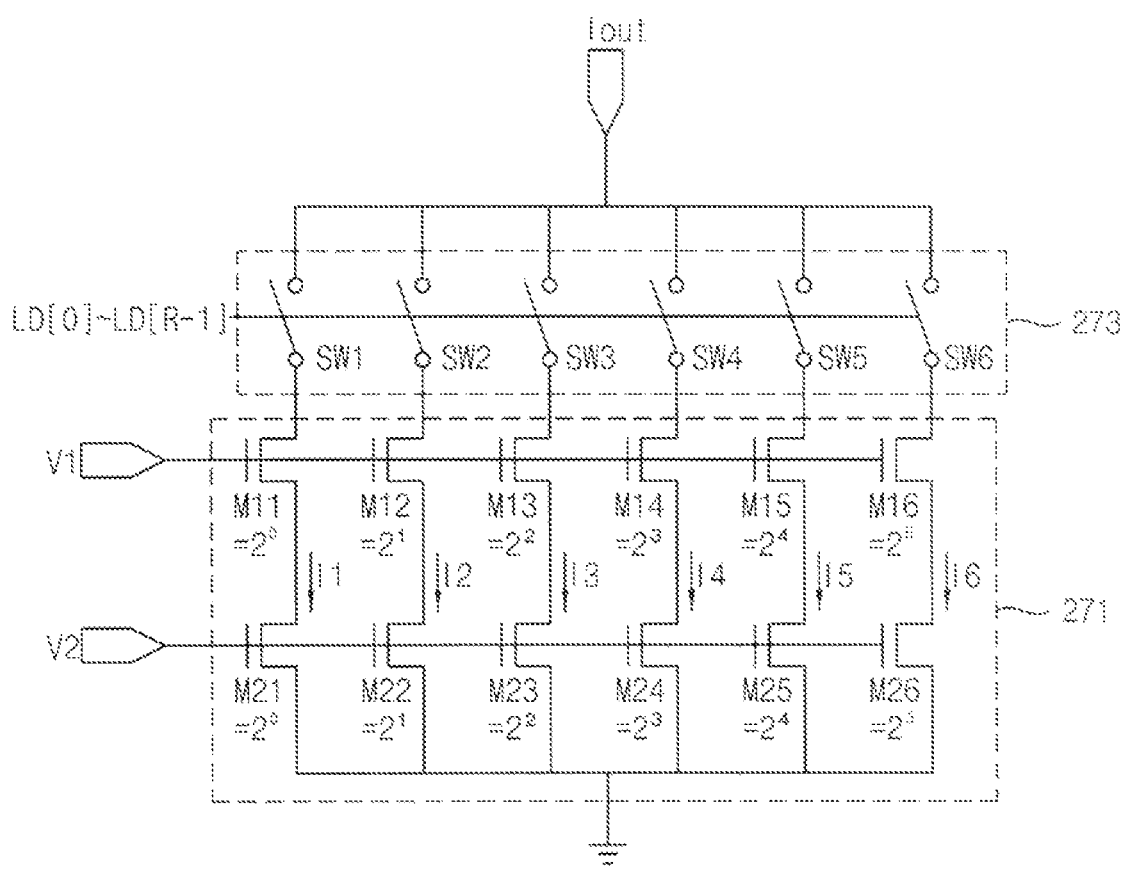
FIG. 6 is a circuit diagram illustrating a second digital-to-analog converter unit according to an example embodiment.

FIG. 6 is a circuit diagram illustrating a second DAC unit according to an example embodiment. In FIG. 6, the R-bit lower data (LD) is 6-bit data.

Referring to FIG. 6, the second DAC unit 270 includes a weighted current generation unit 271 and a switching unit 273. The weighted current generation unit 271 includes a plurality of pairs of MOS transistors M11 and M21, M12 and M22, M13 and M23, M14 and M24, M15 and M25, and M16 and M26. Each pair includes a first MOS transistor M11, M12, M13, M14, M15, and M16 and a second MOS transistor M21, M22, M23, M24, M25, and M26. Each of the pairs is connected in parallel with respect to each other. The first MOS transistor (for example M11) and the second MOS transistor (for example M12) of each pair are connected in series with respect to each other. The first voltage V1 is applied to each gate of the first MOS transistors M11, M12, M13, M14, M15, and M16, and the second voltage V2 is applied to each gate of the second MOS transistors M21, M22, M23, M24, M25, and M26. The NMOS transistor N1 of FIGS. 4 and 5 and each pair of the transistors M11 and M21, M12 and M22, M13 and M23, M14 and M24, M15 and M25, and M16 and M26 respectively constitute a current mirror. Therefore, when each size of the NMOS transistors N2 and N3 is represented as 1, each size of the first MOS transistors M11, M12, M13, M14, M15, and M16 is represented as 1, 2, 4, 8, 16 and 32, and each size of second MOS transistors M21, M22, M23, M24, M25, and M26 is also represented as 1, 2, 4, 8, 16 and 32. Therefore, each size of the first MOS transistors M11, M12, M13, M14, M15, and M16 and the second MOS transistors M21, M22, M23, M24, M25, and M26 may be represented as $2^0$, $2^1$, $2^2$, $2^3$, $2^4$ and $2^5$. When each current flowing through each pair of MOS transistors is represented as I1, I2, I3, I4, I5 and I6 as illustrated in FIG. 6, I1 corresponds to Iref2, I2 corresponds to 2*Iref2, I3 corresponds to 4*Iref2, I4 corresponds to 8*Iref2, I5 corresponds to 16*Iref2, and I6 corresponds to 32*Iref2.

The switching unit 273 includes a plurality of switches SW1~SW6. Each of the switches SW1~SW6 is connected to each of the first MOS transistors M11, M12, M13, M14, M15, and M16. In addition, each of the switches SW1~SW6 receives each bit of the R-bit lower data LD, and each of the switches SW1~SW6 is turned on or off according to each bit level of the R-bit lower data LD. Therefore, a relationship of the analog current Iout and the currents I1~I6 is represented as follows:

$$Iout = Iref1 * (2^0 * LD0 + 2^1 * LD1 + 2^2 * LD2 + 2^3 * LD3 + 2^4 * LD4 + 2^5 * LD5) / 2^6 \quad \text{[Equation 5]}$$

Table 1 below represents the analog current Iout according to each bit of the R-bit lower data LD, when the R-bit lower data LD is 6-bit data.

TABLE 1

| LD[5:0] | Iout |
|---|---|
| 0000001 | $1/2^6 * (2^0) * Iref1$ |
| 0000010 | $1/2^6 * (2^1) * Iref1$ |
| ... | ... |
| 100101 | $1/2^6 * (2^0 + 2^2 + 2^5) * Iref1$ |
| ... | ... |
| 111111 | $1/2^6 * (2^0 + 2^1 + 2^2 + 2^3 + 2^4 + 2^5) * Iref1$ |

Accordingly, when Equation 5 is inserted into Equation 2, the result is represented as follows:

$$Vout = Vc + (R2/R1) * Vref * 1/2^6 * (2^0 LD0 + 2^1 * LD1 + 2^2 * LD2 + 2^3 * LD3 + 2^4 * LD4 + 2^5 * LD5) \quad \text{[Equation 6]}$$

Equation 6 represents the driving voltage Vout when the positive gamma voltages VGH are applied to the first DAC unit 260 in FIG. 2.

Similarly, when Equation 5 is inserted into Equation 3, the result is represented as follows:

$$Vout = Vc - (R2/R1) * Vref * 1/2^6 * (2^0 * LD0 + 2^1 * LD1 + 2^2 * LD2 + 2^3 * LD3 + 2^4 * LD4 + 2^5 * LD5) \quad \text{[Equation 7]}$$

Referring to Equations 5 to 7, a magnitude of the analog current Iout is determined by each bit level of the R-bit lower data LD which is 6-bit. Therefore, a magnitude of the driving voltage Vout is obtained by adding the converted voltage from the analog current Iout to the analog voltage Vc, or subtracting the converted voltage from the analog current Iout from the analog voltage Vc, where the analog voltage Vc is determined by the Q-bit upper data UD applied to the first DAC unit 260, and the analog current Iout is determined by the R-bit lower data LD applied to the second DAC unit 270. When the P-bit RGB data includes 12 bits, the Q-bit upper data UD includes 6 bits, and the R-bit lower data LD includes 6 bits, the analog voltage Vc may be one of $2^6$ gray voltages, and the analog current Iout may be one of $2^6$ combinations of the currents I1~I6. Therefore, the magnitude of the driving voltage Vout may be one of $2^{12}$ combinations. Therefore, the driving voltage Vout may be represented as $2^{12}$ combinations.

As illustrated with reference to FIG. 2, the first DAC unit 260 is provided with a relatively high voltage, such as the gamma voltages VGH and VGL, to provide various gray voltages. Although not illustrated, the second DAC unit 270 is provided with a relatively low voltage, such as the power supply voltage VDD, since the second DAC unit 270 includes MOS transistors. Therefore, the second DAC unit 270 does not need high voltage logic circuits such as a level shifter or an inverter to raise the voltage level of the R-bit lower data LD thereby reducing a circuit area.

Figure 7:
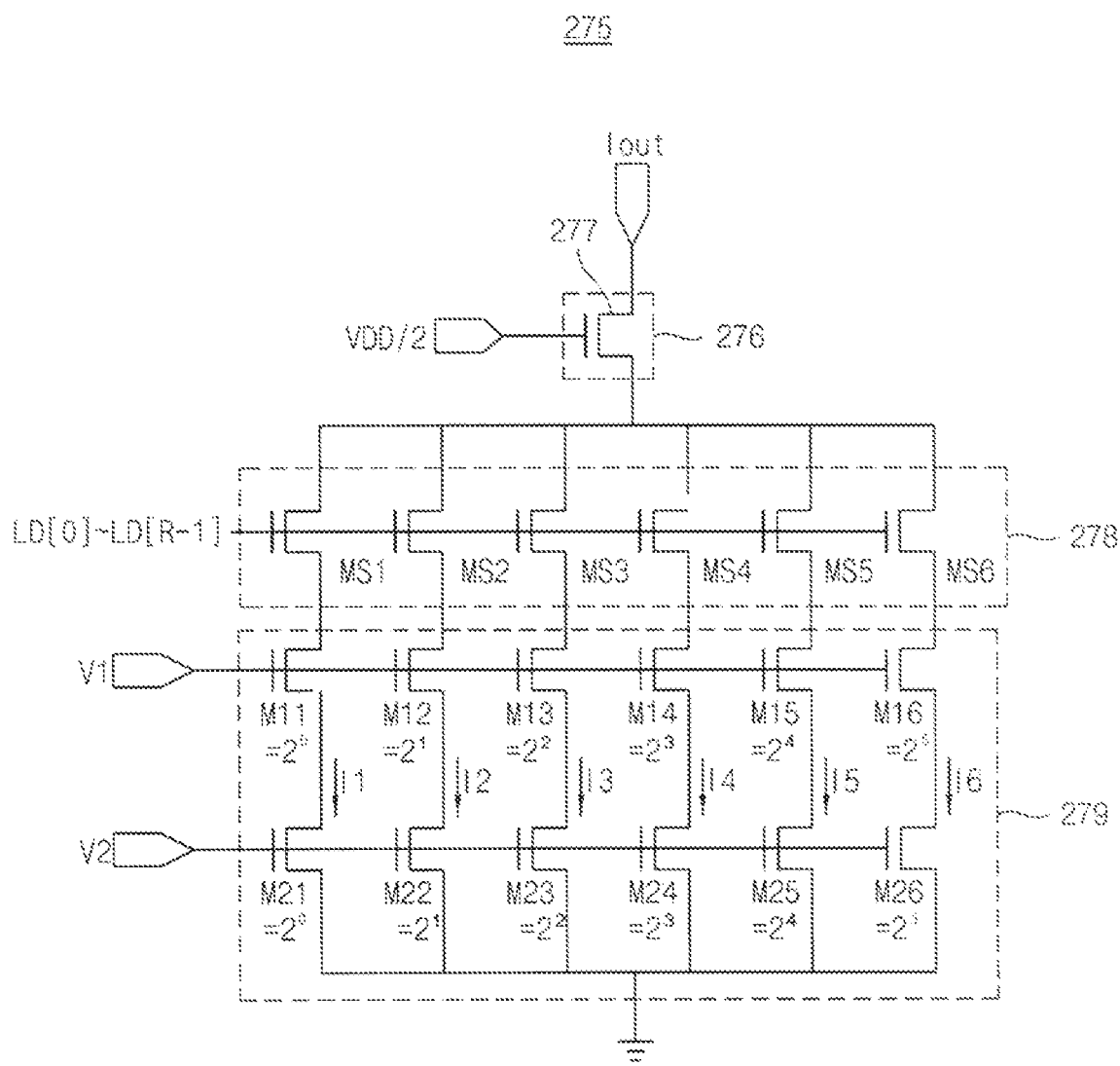
FIG. 7 is a circuit diagram illustrating a second digital-to-analog converter unit according to another example embodiment.

FIG. 7 is a circuit diagram illustrating a second DAC unit according to another example embodiment.

Referring to FIG. 7, a second DAC unit 275 includes a protection circuit 276, a switching unit 278 and a weighted current generation unit 279.

Operation and architecture of the weighted current generation unit 279 of FIG. 7 is substantially the same as the weighted current generation unit 271 of the FIG. 6, and thus detailed description of the weighted current generation unit 279 will be omitted.

The protection circuit 276 includes an NMOS transistor 277. The analog current Iout is provided at a drain of the NMOS transistor 277, and a power supply voltage VDD/2 is applied to a gate of the NMOS transistor 277. The weighted current generation unit 279 includes a plurality of pairs of NMOS transistors M11 and M21, M12 and M22, M13 and M23, M14 and M24, M15 and M25, and M16 and M26, and each of the NMOS transistors M11 and M21, M12 and M22, M13 and M23, M14 and M24, M15 and M25, and M16 and M26 has a thin gate oxide, that is, each of the NMOS transistors M11 and M21, M12 and M22, M13 and M23, M14 and M24, M15 and M25, and M16 and M26 is a low voltage NMOS transistors. On the contrary, the NMOS transistor 277 has a thick gate oxide, that is the NMOS transistor 277 is a high voltage transistor thereby preventing each gate oxide of the NMOS transistors M11, M12, M13, M14, M15 and M16 from being broken down. In addition, each of NMOS transistors MS1, MS2, MS3, MS4, MS5 and MS6 of the switching unit 278 has a thick gate oxide, that is each of NMOS transistors MS1, MS2, MS3, MS4, MS5 and MS6 is a high voltage transistor thereby reducing each drain voltage of the NMOS transistors M11 and M21, M12 and M22, M13 and M23, M14 and M24, M15 and M25, and M16 and M26 lower than the power supply voltage VDD.

Figure 8:
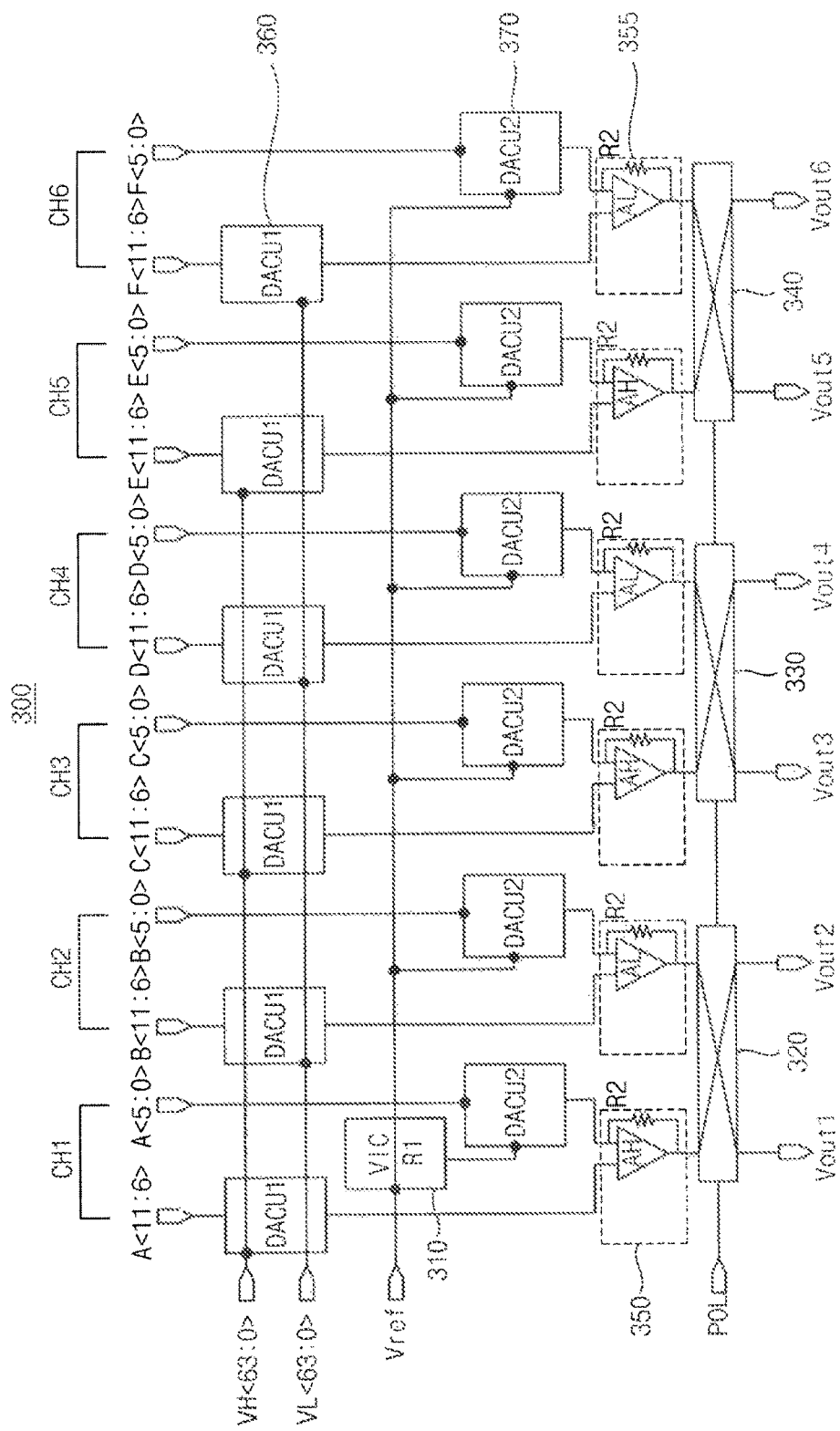
FIG. 8 illustrates that the source driver of example embodiments is employed in a driving integrated circuit that includes a plurality of channels.

FIG. 8 illustrates that the source driver of the above example embodiments may be employed in a driving integrated circuit (IC) 300 that includes a plurality of channels.

Referring to FIG. 8, each of a plurality of channels CH1~CH6 includes a first DAC unit 360 DACU1, and a second DAC unit 370 DACU2. The first DAC units 360 may correspond to the first DAC unit 260 of FIGS. 2 and 3, for example. The second DAC units 370 may correspond to the second DAC units 270 and 275 of FIGS. 2 and 4-7. In other words, one or more of the second DAC units may correspond to the second DAC unit 270 and one or more of the second DAC units may correspond to the second DAC unit 275. The plurality of channels CH1~CH6 may share one VIC 310, which may correspond to the VIC 280 of FIGS. 5 and 6.

Each of the channels CH1, CH3 and CH5 includes a buffer 350 which may include an operational amplifier AH to implement positive gammas, and each of the channels CH2, CH4, and CH6 includes a buffer 355 which may include an operational amplifier AL to implement negative gammas. The buffers 350 having the operational amplifier AH may correspond to the output buffer unit 231 of FIG. 4, and the buffers 355 having the operational amplifier AL may correspond to the output buffer unit 233 of FIG. 5.

Since the VIC 310 is shared by the plurality of channels CH1~CH6, a circuit size of the driving IC 300 may be reduced and accuracy of driving voltages Vout1~Vout6 may be enhanced. In addition, mismatch of a resistor R1 of the VIC 310 and the resistor R2 may be reduced by selecting a value of the resistor R1 that is near the value of the resistor R2. In addition, an offset of the first operational amplifier 281 included in the VIC 310 may be reduced. For example, a ratio of the first resistor R1 to the second resistor R2 may be set to 6 to 1 to thereby reduce the offset of first operational amplifier 281 by ⅙. Outputs of the operational amplifiers AH and AL of each of the channels CH1~CH6 are provided as driving voltages Vout1~Vout 6 with or without a polarity being inverted through inverting units 320, 330, 340 under control of a polarity control signal POL.

The hybrid DAC according to example embodiments may reduce a circuit size and display high quality images by including the first DAC unit which is a resistor string type operating with a high voltage and the second DAC unit which is a binary-weighted current type operating with a low voltage. Therefore, the hybrid DAC may be applicable to a display device which processes a great amount of data.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present general inventive concept. Accordingly, all such modifications are intended to be included within the scope of the present general inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Although a few embodiments of the present invention have been shown and described, it would be appreciated by those skilled in the art that changes may be made in these embodiments without departing from the principles and spirit of the general inventive concept, the scope of which is defined in the claims and their equivalents.

What is claimed is:

1. An integrated circuit to control voltage output to a display panel, the integrated circuit comprising:
    at least one first channel including a first digital-to-analog converter unit ("DAC unit") and a second DAC unit to output voltages corresponding to high bits and low bits, respectively, of a first segment of a voltage control signal;
    at least a second channel including a third DAC unit and a fourth DAC unit to output voltages corresponding to a second segment of a voltage control signal;
    a gamma voltage generation unit to provide gamma voltages directly to the first and third DAC units; and
    a single voltage-to-current converter ("VIC") to provide input voltage directly to the second and fourth DAC units.

2. The integrated circuit according to claim 1, wherein the first and second channels further include first and second output buffers, respectively, to receive voltage outputs from the first, second, third, and fourth DAC units, respectively, and to output high and low driving voltages, respectively.

3. A hybrid digital-to-analog converter ("DAC"), comprising:
    a first digital-to-analog converting unit ("DAC unit") to receive first digital display data and high and low gamma voltages and to output a corresponding analog voltage;
    a second DAC unit to receive second digital display data and a first current and to output a corresponding analog current; and
    a decoder to receive the first digital display data and to control the switching unit to output a predetermined voltage corresponding to a fraction of the one of the high and low gamma voltages,
    wherein one of the first and second digital display data corresponds to high bits of a display data segment and the other of the first and second digital display data corresponds to low bits of the display data segment.

4. The hybrid DAC according to claim 3, wherein the first digital-to-analog converting unit comprises:
    a gray voltage generation unit to receive one of the high and low gamma voltages; and
    a switching unit to receive a plurality of gray voltages from the gray voltage generation unit.

5. The hybrid DAC according to claim 4, wherein the gray voltage generation unit comprises a plurality of resistors connected in series,
    the switching unit comprises a plurality of transistors, each having a source connected between two of the plurality of resistors, respectively, and a drain connected to a drain of each other transistor of the plurality of transistors, and
    the decoder controls a voltage to a gate of each of the plurality of transistors to turn on and off each of the plurality of transistors.

6. The hybrid DAC according to claim 3, wherein the second DAC unit comprises:
    a weighted current generation unit to receive first and second input voltages of the first current and to output a plurality of currents; and
    a switching unit to output the analog current corresponding to a combination of the plurality of currents from the weighted current generation unit.

7. A hybrid digital-to-analog converter ("DAC"), comprising:
- a first digital-to-analog converting unit ("DAC unit") to receive first digital display data and high and low gamma voltages and to output a corresponding analog voltage; and
- a second DAC unit to receive second digital display data and a first current and to output a corresponding analog current,
- wherein one of the first and second digital display data corresponds to high bits of a display data segment and the other of the first and second digital display data corresponds to low bits of the display data segment;
- wherein the second DAC unit comprises:
- a weighted current generation unit to receive first and second input voltages of the first current and to output a plurality of currents; and
- a switching unit to output the analog current corresponding to a combination of the plurality of currents from the weighted current generation unit; and
- wherein the weighted current generation unit includes a plurality of pairs of transistors, a transistor of each pair connected in series with another transistor of the pair and with a respective switch of the switching unit, each pair of transistors connected in parallel with each other pair of transistors,
- a gate of a first transistor of each pair of transistors is connected to the first input voltage, and
- a gate of a second transistor of each pair of transistors is connected to the second input voltage.

8. The hybrid DAC according to claim 6, wherein the switching unit comprises a plurality of transistors, each transistor having a gate connected to a respective bit of the second digital display data.

9. The hybrid DAC according to claim 6, further comprising:
- a protection circuit consisting of a transistor having an input terminal connected to an output of each of the plurality of transistors of the switching unit and an output terminal to output the analog current.

10. A source driver to drive a display, comprising:
- an input unit to receive input data and an input clock and to output digital display data; and
- a hybrid digital-to-analog converter (DAC), comprising:
  - a first digital-to-analog converting unit ("DAC unit") to receive first digital display data and high and low gamma voltages and to output a corresponding analog voltage; and
  - a second DAC unit to receive second digital display data and a first current and to output a corresponding analog current; and
  - a decoder to receive the first digital display data and to control the switching unit to output a predetermined voltage corresponding to a fraction of the one of the high and low gamma voltages,
- wherein one of the first and second digital display data corresponds to high bits of a display data segment and the other of the first and second digital display data corresponds to low bits of the display data segment.

11. The source driver according to claim 10, further comprising:
- a gamma voltage generation unit to generate the high and low gamma voltages; and
- a voltage-to-current converter to generate first and second voltages having the first current.

12. The source driver according to claim 10, further comprising:
- an output buffer unit to receive the analog voltage and the analog current and to output a display-driving voltage corresponding to the analog voltage and the analog current.

13. The source driver according to claim 12, wherein the output buffer comprises:
- an operational amplifier (op-amp) having a positive and a negative input terminal and an output terminal; and
- a resistor connected between the output terminal and one of the positive and negative input terminals,
- wherein one of the analog voltage and the analog current is connected to the positive terminal and the other of the analog voltage and the analog current is connected to the negative terminal, and
- the resistor is connected to the one of the positive and negative input terminals that corresponds to the analog current.

14. A source driver to drive a display, comprising:
- an input unit to receive input data and an input clock and to output digital display data; and
- a hybrid digital-to-analog converter (DAC), comprising:
  - a first digital-to-analog converting unit ("DAC unit") to receive first digital display data and high and low gamma voltages and to output a corresponding analog voltage; and
  - a second DAC unit to receive second digital display data and a first current and to output a corresponding analog current,
- wherein one of the first and second digital display data corresponds to high bits of a display data segment and the other of the first and second digital display data corresponds to low bits of the display data segment;
- the source driver further comprising an output buffer unit to receive the analog voltage and the analog current and to output a display-driving voltage corresponding to the analog voltage and the analog current
- wherein the output buffer comprises:
- an operational amplifier (op-amp) having a positive and a negative input terminal and an output terminal; and
- a resistor connected between the output terminal and one of the positive and negative input terminals,
- wherein one of the analog voltage and the analog current is connected to the positive terminal and the other of the analog voltage and the analog current is connected to the negative terminal, and
- the resistor is connected to the one of the positive and negative input terminals that corresponds to the analog current,
- and the source driver further comprising
- a current mirror circuit connected between an output of the second DAC unit and the one of the positive and negative input terminals that corresponds to the analog current.

15. A display device, comprising:
- a display panel to display an image, the display panel including gate lines and source lines;
- a gate driver to drive the gate lines;
- a source driver to drive the source lines, the source driver comprising:
  - an input unit to receive input data and an input clock and to output digital display data; and
  - a hybrid digital-to-analog converter (DAC), comprising:
    - a first digital-to-analog converting unit ("DAC unit") to receive first digital display data and high and low gamma voltages and to output a corresponding analog voltage; and a second DAC unit to receive second digital display data and a first current and to output a corresponding analog current; and a decoder to receive the first digital display data and to control the switching unit to output a predetermined voltage corresponding to a fraction of the one of the high and low gamma voltages; and wherein one of the first and second digital display data corresponds to high bits of a display data segment and the other of the first and second digital display data corresponds to low bits of the display data segment.

16. The display device according to claim 15, wherein the panel is an LCD panel.

17. The display device according to claim 15, further comprising:

a timing controller to receive display data and at least one clock signal and to output the first and second digital display data corresponding to the received display data and the at least one clock signal to the first and second DAC units respectively.

* * * * *